United States Patent [19]

Wittmer

[11] Patent Number: 4,868,573

[45] Date of Patent: Sep. 19, 1989

[54] LINE FREQUENCY SLAVED VOLTAGE-TO-FREQUENCY CONVERTER SYSTEM

[75] Inventor: Charles M. Wittmer, Trumbull, Conn.

[73] Assignee: The Perkin-Elmer Corporation, Norwalk, Conn.

[21] Appl. No.: 119,594

[22] Filed: Nov. 12, 1987

Related U.S. Application Data

[63] Continuation of Ser. No. 927,991, Nov. 7, 1986, abandoned.

[51] Int. Cl.$^4$ .............................................. H03M 1/60
[52] U.S. Cl. .................................. 341/157; 356/226; 324/322
[58] Field of Search ............... 341/155, 157, 166, 167, 341/118, 137; 324/99 D, 318, 322; 356/226, 319

[56] References Cited

U.S. PATENT DOCUMENTS

| | | | |
|---|---|---|---|
| 4,201,472 | 5/1980 | Maeda | 356/226 |
| 4,412,744 | 11/1983 | Lee et al. | 356/319 |
| 4,435,697 | 3/1984 | Takahashi | 341/157 |
| 4,644,323 | 2/1987 | Chamran et al. | 341/167 |

OTHER PUBLICATIONS

"Synchronized Voltage-to-Frequency Converter", by Burr-Brown.
"Monolithic Synchronous Voltage-to-Frequency Converter", by Analog Devices.
"Clocked V-F Converter Tightens Accuracy and Raises Stability", by Burr-Brown.

*Primary Examiner*—William M. Shoop, Jr.
*Assistant Examiner*—Brian Young
*Attorney, Agent, or Firm*—Ronald G. Cummings; Edwin T. Grimes; Thomas P. Murphy

[57] ABSTRACT

The system includes a synchronous voltage-to-frequency converter connected to receive an analog input signal voltage and to generate a train of output pulses. A counter is connected to receive and count the output pulses and a digital register is connected to the counter for periodically receiving and storing the count in the counter. A conversion interval timer circuit is connected to control the operation of the counter and the register to determine a conversion interval during which the output pulses from the synchronous voltage-to-frequency converter are accumulated in the counter and then stored in the register. The conversion interval timer circuit is operable to determine the end of a prior conversion interval and the beginning of a new conversion interval in response to a predetermined phase of a predetermined cycle of the ac power line voltage. A timer is provided for exact measurement of the duration of each conversion interval and a multiplier is provided for multiplying the number stored in the register by a function which is a reciprocal of the exact duration measurement from the timer to thereby contact the number for variations in the conversion interval.

21 Claims, 2 Drawing Sheets

LINE FREQUENCY SLAVED VOLTAGE-TO-FREQUENCY CONVERTER SYSTEM

CROSS-REFERENCE TO RELATED APPLICATION

This application is a continuing application of U.S. Pat. Ser. No 927,991, filed Nov. 7, 1986 now abandoned.

BACKGROUND OF THE INVENTION

In precision instrumentation, and particularly in electro-optical precision instrumentation, and especially in spectrophotometers which may be used for purposes such as optical chemical analysis, it is extremely important to avoid or eliminate noise interference signals from electrical measurement signals. Some of the most persistent and serious sources of such noise and interference are related to the alternating current power supply. For instance, ambient room illumination from gaseous discharge lamps such as fluorescent lamps varies substantially in response to the alternations of the power frequency. Similarly, the fluctuations in the voltage of the power supply to the spectrophotometer cannot be completely filtered out, and may appear in the output signal. Also, ambient acoustic signals which are power frequency related can arise from electrical apparatus which is in operation near the spectrophotometer, and which can create minute mechanical movements of optical components which give rise to further power frequency-related noise.

Accordingly, it is an important object of the present invention to provide an analog-to-digital converter system which eliminates power line frequency related noise and interference signals from an analog voltage signal as converted to a digital signal.

It is known that power line frequency noise signals can be eliminated by selecting a conversion interval for an analog-to-digital converter which corresponds to the cycle interval of the power line or to exact multiples of that interval. Accordingly, the selection of conversion intervals corresponding to the power line cycle interval is advocated. However, different power line frequencies are employed such as 50 cycles as well as 60 cycles. Furthermore, the frequency of the power line may be intentionally or unintentionally varied from a strictly regulated 60 cycle or 50 cycle frequency. For instance, in some communities in the world it is common to increase the power line frequency after a power shutdown in order to readjust the customer's clocks. In other systems, such as small independent power systems, the frequency of the power system is not carefully regulated. Accordingly, it is not possible to achieve complete and reliable power line frequency related noise elimination from the signal being processed by simply determining the conversion interval as a fixed interval corresponding to the nominal power line cycle interval.

Accordingly, it is another important object of the present invention to provide an analog-to-digital converter system which will automatically eliminate power line related noise from the signal being converted no matter what the power line frequency may be, and no matter how the power line frequency may vary.

Further objects and advantages of the invention will be apparent from the following description and the accompanying drawings.

SUMMARY OF THE INVENTION

In carrying out the invention, there is provided a system for precision conversion of an analog input signal represented by a voltage to an output digital signal represented by a number comprising a synchronized voltage-to-frequency converter connected to receive the analog input signal voltage and to generate a train of output pulses, a counter connected to receive and count the output pulses from said synchronized voltage-to-frequency converter, a digital register connected to said counter for periodically receiving and storing the count in said counter, a conversion interval timer circuit connected to control the operation of said counter and said register to determine a conversion interval during which the output pulses from said synchronous voltage-to-frequency converter are accumulated in said counter and then stored in said register, said conversion interval timer circuit being connected and arranged to receive ac power line voltage and being operable to determine the end of a prior conversion interval and the beginning of a new conversion interval and the beginning of a new conversion interval in response to a predetermined phase of a predetermined cycle of the ac power line voltage, means for receiving and correcting the number from said register comprising means for exact measurement of the duration of each conversion interval and means for multiplying the number stored in said register by a function which is a reciprocal of the exact duration measurement from said exact measurement means to thereby correct the number for variations in the conversion interval.

In a preferred embodiment, the invention also includes a programmable gain amplifier which makes the analog-to-digital converter extremely sensitive over a wide signal range, essentially increasing the range of the amplifier by a ratio of ten to one and a one hundred to one.

In accordance with another feature of a preferred embodiment of the invention, the cost of the analog-to-digital converter incorporated in the analog-to-digital conversion system is greatly reduced, and the accuracy is improved, by employing a synchronous analog-to-digital converter circuit.

DESCRIPTION OF PREFERRED EMBODIMENTS

Figure 1:
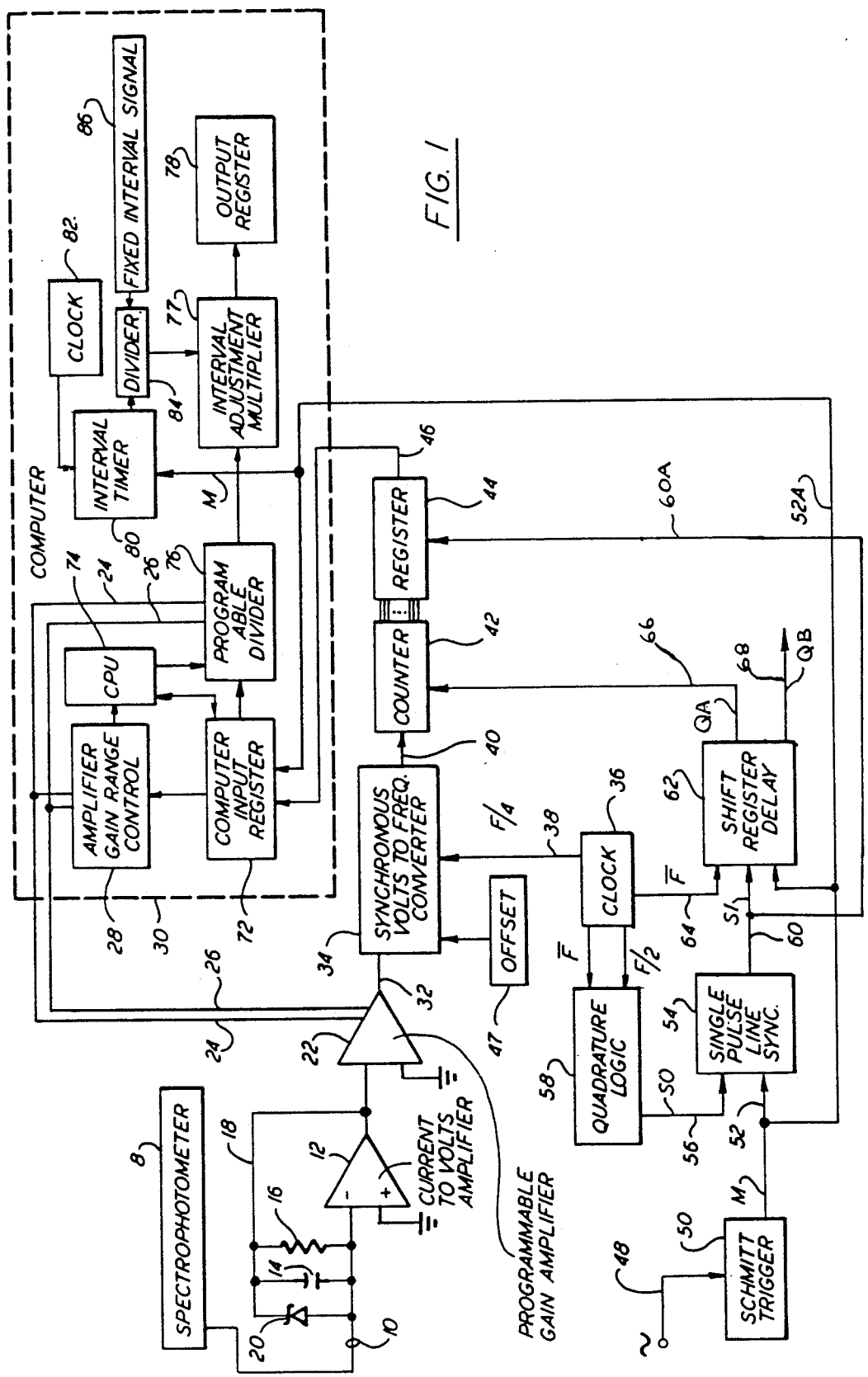
FIG. 1 is a schematic circuit diagram of a preferred apparatus for carrying out the invention.

Referring more particularly to FIG. 1, there is shown a schematic circuit diagram of a preferred embodiment of an apparatus for carrying out the invention. The system includes an input terminal 10 for receiving the analog input signal which is to be converted to a digital signal output. The input signal to terminal 10 is typically obtained from a precision measuring instrument such as a spectrophotometer 8. The signal from terminal 10 is applied to a preamplifier 12, which is preferably a field effect transistor operational amplifier connected in a "current-to-voltage" configuration. A voltage-to-voltage configuration could also be used for preamplifier 12. The capacitor 14 and the resistor 16 connected in the feedback loop 18 form a first order low-pass filter at approximately 30 hertz to reduce any spurious noise in the input signal. The zener diode 20, which is also connected in the feedback circuit 18, limits the output voltage of the amplifier at a nominal 12 volts. The system is not designed to respond to input voltages above 10 volts, and the zener diode 20 provides for overload protection, and for faster recovery from overload conditions.

If desired, the output of the preamplifier 12 can be connected to a separate amplifier (not shown) to drive an analog signal recorder. However, that feature does not constitute a part of the present invention.

The output from the preamplifier 12 is connected to the input of an amplifier 22, which is a programmable gain amplifier. The gain of amplifier 22 is controllable through input connections 24 and 26 from an amplifier gain range control circuit 28 which comprises part of a digital computer 30. The programmable gain amplifier 22 is changeable in range in ten to one steps to provide a total range change ratio of one hundred to one to accommodate for different input signal voltages. Binary, or other gain change ratios can also be used. The mode of control for the changes in range is described more fully below. Programmable gain amplifiers of the above description are commonly available. One commercially available device of this type which has been found to be satisfactory in the present circuit is an amplifier device model number PGA102 available from Burr-Brown Corporation, P.O. Box 11400, Tuscon, Ariz. 85734.

The output signal from the programmable gain amplifier 22 is carried through connection 32 to a voltage-to-frequency converter 34. The voltage-to-frequency converter 34 is preferably carried out as a synchronous voltage-to-frequency converter which means that the frequency converter operates under the control of a clock circuit 36 through a control connection 38 to provide output pulses at the output connection 40 which occur only at timed intervals. If the input voltage is below the maximum input, output pulses are omitted at some of the timed intervals. The number of pulses delivered over a given period provide the digital output. Such synchronized voltage-to-frequency converters are commercially available. For instance, one satisfactory converter is product number AD651 available from Analog Devices of 2 Technology Way, Norwood, Mass. 02062-9106. Another satisfactory converter is available under model number VFC100 from Burr-Brown. Since these devices are known, they are not described in detail here. However, in general terms, the synchronous voltage-to-frequency converter 34 includes an integrator circuit at the input, a comparator circuit which compares the output of the integrator circuit with a constant reference voltage, and a clock logic circuit which provides a clocked output pulse, as determined by the clock 36, and resets the integrator circuit upon the occurrence of each clock pulse which occurs after the comparator circuit indicates that the integrator output has progressed beyond the reference voltage. The reset of the integrator circuit results in clocked output pulses which occur at an average rate corresponding to the input voltage. The output pulses are carried by the connection 40 to a counter 42 where the count is accumulated for a conversion interval, and that count is then transferred to a digital register 44 where it is available through a connection schematically indicated at 46 to the computer 30. A fixed positive offset signal is preferably applied to the converter 34 by an offset circuit 47 to assure that the converter 34 is always in the active operating range. A number corresponding to this offset is stored in computer 30 and is subtracted from each measurement stored in computer register 72 to compensate for the offset.

In accordance with an important feature of the present invention, the conversion interval during which the counter 42 accumulates the counts from the converter 34 is exactly synchronized with the period of one cycle of the power on the local power line. The power line frequency is applied at terminal 48, shown in the lower left corner of the drawing, and through that terminal to a Schmitt trigger circuit 50, which converts the power line input to a square wave signal which is designated M. That signal is applied, as shown, to an input connection 52 of a single pulse line synchronization circuit 54. The single pulse line synchronization circuit 54 is also provided with a clock signal SO through a connection 56. The clock signal SO derived from the clock circuit 36 through a quadrature logic circuit 58. The single pulse line synchronization circuit 54 is designed so that upon the first clock synchronization pulse SO following the leading edge of a power frequency derived pulse M, a single control pulse output S1 is provided at connection 60. That single pulse is provided to a shift register delay circuit 62, which is then operable under the control of the clock 36 through a connection 64 to provide control pulses QA and QB on the output connections 66 and 68. The S1 pulse on connection 60A is connected to control the register 44 to read the count data stored in the counter 42, which marks the end of the conversion interval. Immediately subsequent to that operation, the QA pulse appears on connection 66 to reset the counter 42 to begin a new conversion interval. At about the same time, the M signal is supplied from the Schmitt trigger 50 through a connection 52A to the computer 30 as a "data ready" signal, telling the computer that it can read the data available from register 44 on connection 46.

Strictly speaking, the data is not actually ready until after the S1 pulse on connection 60A causes the register 44 to read the contents of the counter 42. Since the control pulse S1 occurs slightly after the beginning of the M pulse, the M pulse "data ready" signal on connection 52A to the computer is slightly early. However, the computer is programmed to always respond with some delay to the data ready signal. Thus, the data in the register 44 which is read by the computer is the latest data which has been read from the counter under the control of the S1 pulse. If this is a problem, however, the data ready signal can be provided from a QB output from the shift register delay circuit 62 which occurs after the S1 and QA outputs. The timing of the operation of the circuits which provide the sample interval control signals S1, QA and M will be better understood by reference to FIG. 2, and the explanation of FIG. 2 which appears below.

Referring further to FIG. 1, in addition to the amplifier range control circuit 28, the computer 30 may include a computer input register 72, a central processing unit 74, a programmable divider 76, and an output register 78. The computer input register 72 receives the accumulated count values from the register 44 through connection 46 when the data ready signal is available on connection 52A. The amplifier gain range control 28 and the programmable divider 76 each receive the counts stored in the computer input register 72. The amplifier range control controls the amplification range of the amplifier 22 based upon the count present in the computer input register 72 from the prior conversion interval. The programmable divider 76 is also operable under the control of the gain range control 28 to divide the output from the register 72 by the amplification ratio to compensate for amplifier gain range control settings, and the divided output is supplied through an interval adjustment multiplier 77 to the output register 78. The interval adjustment multiplier 77 adjusts the count from the sample interval to automatically adjust for variations in the frequency interval of the power source. The power source interval is measured by an interval timer 80 to time the interval between successive power line synchronization signal pulses M. The interval timer 80 operates under the control of a computer clock 82.

It is one of the most important features of the present invention that the system can accommodate for fluctuations in the power frequency. The apparatus such as the spectrophotometer 8, of which the present invention may form a part, may sometimes be used under conditions where the power frequency is not controlled with great precision, or in which the power frequency may be intentionally altered in order to correct synchronous electric clocks after a power interruption. Accordingly, the present system synchronizes with the power frequency interval, no matter what that frequency may be, and the interval timer 80 controls the interval adjustment multiplier 77 to appropriately correct the count taken during the sample interval to compensate for variations in the power frequency interval.

This feature can not only automatically adjust the operation of the system for minor frequency fluctuations, but can also automatically adjust for intentional changes to other power frequencies such as 50 hertz.

The most important advantage of the exact synchronization of the operation of the converter system with the interval of the power frequency is that it provides for automatic rejection of line frequency noise signal components. This is extremely important in very sensitive apparatus such as spectrophotometers, for which the present invention is intended to be used. The rejection of line frequency "noise" is effective with respect to electrical signal noise components and also with respect to acoustic noise, and illumination noise signals which are related to the line frequency.

The interval timer 80 operates to control the interval adjustment multiplier 77 through a divider circuit 84 in conjunction with a fixed interval signal from a fixed interval signal circuit 86. The fixed interval signal from circuit 86 is simply a fixed number, and the divide circuit 84 divides that fixed number by the digital number from the interval timer 80 signifying the duration of the last interval. The result of that division is then used as a multiplication factor in the interval adjustment multiplier 77. Thus, it may be said that the combination of the interval timer and the divide circuit 84 and the fixed interval circuit 86 causes the interval adjustment multiplier 77 to multiply the measurement by a reciprocal function of the time interval measured by the interval timer 80. The result is stored in the output register 78.

Another important advantage of the circuit and system as just described, and particularly of the feature which corrects the counts taken during the conversion interval to conform with a fixed interval signal is that the system corrects for any errors arising from changes in the frequency signals available from the clock 36. Such changes in the clock frequency may arise from drift with time or temperature, for instance. It is assumed, first, that the clock 82 of the computer 30 is very accurate, and will provide a "fixed" standard by which the operation of the voltage-to-frequency converter system may be adjusted through the interval adjustment multiplier 77.

The computer 30 has been presented as incorporating a number of special function circuits and components such as the amplifier gain range control 28, the programmable divider 76, the interval timer 80, etc. The invention may be implemented with a special purpose computer which contains all of these special purpose components. However, it will be understood that the functions may also be performed by mean of a general purpose computer which is programmed to carry out all of the functions described in conjunction with the special purpose components, and those programmed functions may be typically carried out on a time-sharing basis by the general purpose computer, which may be a microcomputer.

Figure 2:
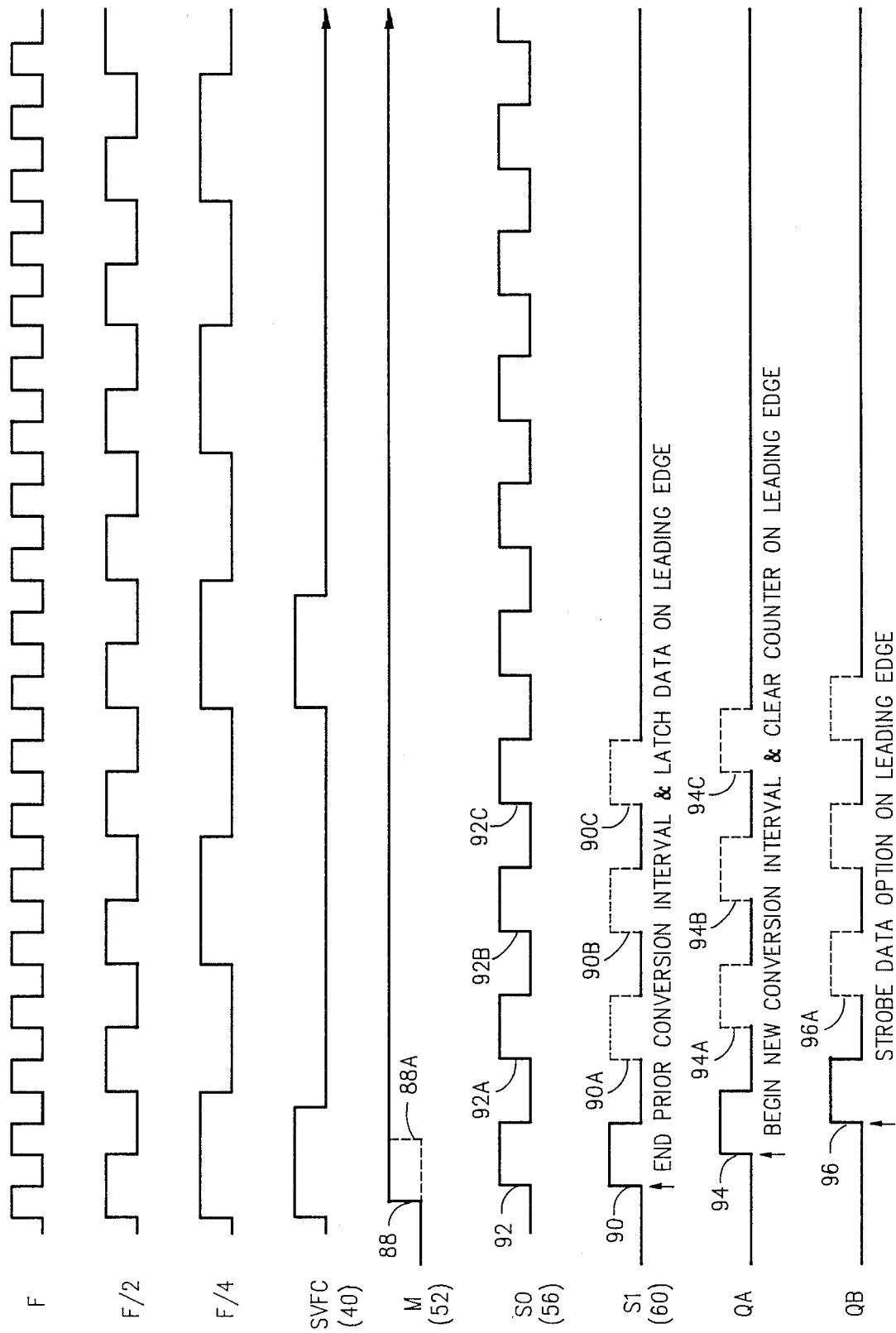
FIG. 2 is a timing diagram illustrating the various timing pulses which are present in the system of FIG. 1, and which particularly illustrate the slaving of the system to the power frequency cycle interval.

FIG. 2 is a timing diagram which further exemplifies the operation of the clock 36, the quadrature logic 58, the Schmitt trigger 50, the single pulse line synchronization circuit 54, and the shift register delay 62. The clock 36 includes a crystal oscillator which is designed to produce a square wave output F as illustrated at the top of the timing diagram FIG. 2. The frequency of that output in the preferred embodiment may be, for instance, 8 megahertz.

The clock circuit 36 is also capable of delivering a phase reversed square wave clock signal shown in the drawing by the symbol $\bar{F}$. The phase reversal F signal is not illustrated in the timing diagram of FIG. 2. The clock circuit 36 is also capable of providing clock pulses at one half the frequency of F and at one quarter of the frequency of F. Those signals are shown in the drawing and are designated as F/2 and F/4 respectively. The F/4 pulses are supplied to the synchronous voltage-to-frequency converter 34 on connection 38, and are used as the basic clock for that circuit. The resultant output signals from converter 34 are at a maximum frequency of one half the F/4 frequency and identified as SVFC in FIG. 2. If a maximum voltage is supplied at input 32 to the synchronous voltage-to-frequency converter 34, then an output pulse appears at the output 40 for every F/8 cycle. However, for any lesser voltage, output pulses are skipped, to give a lower total pulse count in a conversion interval. In the preferred embodiment, the maximum output pulse frequency is about one megahertz.

The power line synchronization signal M, which appears as the output from the Schmitt trigger 50, is not synchronized with the clock 36, and a rising edge of a typical pulse will occur, as indicated at 88 in the M curve of the timing diagram of FIG. 2, at a time which is unrelated to the clock pulses.

The quadrature logic circuit 58 receives the phase reversal $\bar{F}$ clock signal and the F/2 clock signal from clock circuit 36, and in response to those signals generates a pulse train SO which appears at the connection 56. The pulses of that pulse train are delayed, as shown, by one half of the interval of the F frequency curve, and appear at a frequency of F/2. As previously mentioned above, upon the first occurrence of a rising edge 92 of the SO curve after the rising edge 88 of the power frequency synchronization pulse M, the single pulse line synchronization circuit 54 generates a signal pulse S1. That pulse S1 is illustrated at 90 in the curve S1. Describing the operation of the single pulse line synchronization circuit 54 another way, after the rising edge 88 of the line synchronization signal M, the first rising edge 92 of the SO signal causes the single pulse line synchronization circuit 54 to emit the single pulse 90 of curve S1. In response to that signal, the shift register delay circuit 62 generates timing pulses as shown at curves QA and QB in FIG. 2. The QA pulse is shown at 94, and the QB pulse at 96.

The leading edge of the S1 pulse 90 ends the prior conversion interval by enabling the register 44 through connection 60A to read the contents of the counter 42, as previously described. Also, as previously mentioned above, the QA pulse 94 is supplied through connection 66 to the counter 42 to reset that counter to zero to thus begin a new conversion period. Thus, the new conversion period begins at the leading edge of the pulse 94.

If the wave front of the power frequency timing signal M arrives after the SO wave front at 92, such as indicated by the dotted line at 88A, then the single pulse line synchronization circuit 54 is not actuated until the next rising wave front 92A of pulse train SO as shown in FIG. 2. The result is that the single pulse S1 is issued at 90A (shown dotted) in coincidence with pulse 92A, and the QA and QB pulses are delayed as shown dotted respectively at 94A and 96A. In a similar manner, a QA pulse, e.g., 94B or 94C, and corresponding S1 pulse, e.g., 90B or 90C, would be generated by still later arriving respective M wavefronts (not shown). If the M wave front occurs earlier, it may precede an earlier SO wave front, causing an earlier emission of QA and QB pulses. This illustrates how the system is synchronized with the power frequency interval signal M.

The above description of the synchronization or slaving of the system to the power frequency interval is presented entirely in terms of a single power frequency interval, having the conversion interval corresponding exactly to a single power frequency cycle interval. However, it is also possible to achieve the desired discrimination by selecting a conversion interval which is a fixed and predetermined whole multiple of the power frequency cycle interval. Thus, for instance, the end of a prior conversion interval and the beginning of a new conversion interval may be determined in response to a predetermined phase of every third cycle of the ac power line voltage. However, it is not necessary to use the longer interval to get a large sample because it is simple to combine the readings from several conversion intervals to provide greater accuracy as described more fully below.

Referring back again to FIG. 1, the synchronous voltage-to-frequency converter 34, by its nature, has a fixed upper limit of response corresponding to a full count in which an output pulse is provided for every F/8 cycle. With the preferred synchronous voltage-to-frequency output from the converter 34, this occurs at an input voltage of about ten volts. This maximum frequency output from the converter 34 can be recognized in terms of a maximum number count at the computer input register 72 by the amplifier gain range control 28. When this maximum count number is achieved, the amplifier gain range control 28 reduces the amplification factor by changing the setting of the programmable gain amplifier 22 by a signal on one of the lines 24 or 26 (unless the amplifier 22 is already set to the lowest gain). The reduction in amplification is preferably by a ratio of ten to one, to put the converter 34 back into a range where a meaningful measurement can be taken. At the same time, the amplifier gain range control modifies the operation of the programmable divider 76 to reduce the division factor of that circuit by a ratio of ten to one to correct for the lower range in the measurement number ultimately supplied to the output register 78. If the upper limit on the converter 34 is again exceeded, resulting in the maximum output, the amplification factor of the programmable amplifier 22 is again reduced by a ratio of ten to one, (unless the amplifier is already at the lowest amplification setting) and the programmable divider ratio is also again reduced by a ratio of ten to one. The amplifier gain range control 28 may be programmed to respond exactly to the maximum output from the converter 34, or it may be programmed to respond to a number which is near the maximum output count for the conversion interval.

If the input voltage is reduced so that the count from the converter is at a selected value somewhat less than ten percent of the maximum, the amplifier gain range control 28 is operable to increase the amplification factor by a ratio of ten to one, and to increase the division factor of divider 76 by a ratio of ten to one (unless the amplification factor is already at the maximum value). Thus, the amplifier gain range control automatically adjusts the programmable gain amplifier 22 and the programmable divider 76 to provide for a very high degree of accuracy, which provides one hundred times as much resolution as would be provided without the programmable gain amplifier and the associated system just described.

The precision of the system may be greatly enhanced by taking a series of measurements over a successive series of conversion intervals and averaging those measurements. For instance, thirty conversion intervals may be taken and averaged in order to provide high precision, and the total measuring time for the thirty conversion intervals is only half a second at sixty cycles.

In reviewing the timing of the system, as illustrated by the timing diagram of FIG. 2, it is quite clear that the entire power frequency synchronization sequence, as represented by the curves M, SO, S1, QA, and QB occurs in less than one microsecond, and one microsecond is the interval of the one megahertz frequency which is the highest output frequency available from the synchronous voltage-to-frequency converter 34. Accordingly, no output pulses from the synchronous voltage-to-frequency converter 34 are lost because a new conversion interval is commenced as soon as a prior conversion interval is ended. The converter 34 is synchronized to the clock 36 so that an output pulse is not generated between the end of a prior conversion interval and the beginning of the next conversion interval.

At 60 cycles, the maximum number of pulses available in the conversion interval at one megahertz is 16,667 (rounding to the nearest whole number). Since the programmable gain amplifier 22, and the programmable divider 76, provide a multiplication of the resolution of the system by a factor of one hundred, the resolution is actually over a million, being in the order of 1,666,667.

While this invention has been shown and described in connection with particular preferred embodiments, various alterations and modifications will occur to those skilled in the art. Accordingly, the following claims are intended to define the valid scope of this invention over the prior art, and to cover all changes and modifications falling within the true spirit and valid scope of this invention.

I claim:

1. A system for precision conversion of an analog input signal represented by a voltage to an output digital signal represented by a number comprising a synchronous voltage-to-frequency converter connected to receive the analog input signal voltage and to generate a train of output pulses, a counter connected to receive and count the output pulses from said synchronous voltage-to-frequency converter, a digital register connected to said counter for periodically receiving and storing the count in said counter, a conversion interval timer circuit means connected to control the operation of said counter and said register to determine a conversion interval during which the output pulses from said synchronous voltage-to-frequency converter are accumulated in said counter and then stored in said register, said conversion interval timer circuit means being connected and arranged to receive ac power line voltage and being operable to determine the end of a prior conversion interval and the beginning of a new conversion interval in response to a predetermined phase of a predetermined cycle of the ac power line voltage to exactly synchronize the conversion interval to the ac power line frequency, and said conversion interval timer circuit means being configured and connected to said synchronous voltage-to-frequency converter so as to control the generation of output pulses so that output pulses are generated only during a conversion interval.

2. A system as claimed in claim 1 wherein the predetermined cycle for determining the end of a prior conversion interval and the beginning of a new conversion interval is every cycle.

3. A system as claimed in claim 1 wherein the predetermined cycle for determining the end of a prior conversion interval and the beginning of a new conversion interval is separated from the prior predetermined cycle by at least two whole power frequency intervals.

4. The system of claim 1 wherein said timer circuit means comprises a clock means connected to said synchronous converter for controlling the operation of said synchronous converter, said timer circuit means being operable to determine the end of a prior conversion interval and the beginning of a new conversion interval in synchronism with said clock means at clock synchronized times after said predetermined phase of the ac power line voltage.

5. The system of claim 4 wherein said clock means provides clock pulse signals to said synchronous converter at a frequency of F/4 so that the maximum frequency output of said synchronous converter is F/8 and the intervening interval between the end of the prior interval and the beginning of a new conversion interval is synchronized to a multiple frequency of said clock means such that the output pulses from said converter means are generated outside said intervening interval.

6. The system of claim 4 wherein said timer circuit means comprises a single-pulse line synchronization circuit operable to receive clock pulse signals from said clock means at a frequency which is a multiple of the maximum output frequency of said synchronous voltage-to-frequency converter and operable to receive an ac line synchronization signal, said single-pulse line synchronization circuit being operable upon the receipt of the first clock pulse signal after the presence of an ac line synchronization signal to provide a first single pulse output, a shift register delay circuit connected to receive said first single-pulse output and operable in response thereto to emit at least a second pulse output, said single-pulse line synchronization circuit being connected to provide said first single pulse to said register to cause said register to read the count in said counter and said shift register delay circuit being connected to provide said second pulse output to said counter to reset said counter to begin a new conversion interval.

7. The system of claim 6 wherein said clock means generates clock pulse signals in multiples of a predetermined frequency F and said second pulse output being delayed from said first pulse output by ½ of the interval of the frequency F.

8. The system of claim 6 wherein said clock means generates clock pulse signals in multiples of a predetermined frequency F, said clock means providing clock pulse signals to said synchronous converter at a frequency F/4 such that the maximum output frequency of said synchronous converter is F/8, and said clock pulse signals received by said single-pulse line synchronization circuit from said clock means being at a frequency of F/2.

9. The system of claim 8 which comprises quadrature logic circuit means interconnecting said clock means and said single-pulse line synchronization circuit means for providing clock pulse signals to said synchronization circuit means at a frequency F/2 and delayed by ¼ of the interval of the frequency F, said second pulse output being delayed from said first pulse output by ½ of the interval of the frequency F.

10. The system of claim 4 wherein a programmable gain amplifier is connected to receive and amplify the analog input signal prior to delivery of said analog input signal to said synchronous voltage-to-frequency converter, an amplifier gain range control means connected and operable to receive the successive numbers stored in said register and connected to control said programmable amplifier, said amplifier gain range control means being operable in response to the detection of a number from said register indicating that said synchronous voltage-to-frequency converter is running at maximum frequency to reduce the amplification factor of said programmable amplifier, said amplifier gain range control means being operable upon the detection of a number below a predetermined minimum value to increase the amplification factor of said programmable amplifier, and said amplifier gain range control means including means operable to divide the output from said register by said amplification factor to provide an accurately scaled digital output signal.

11. The system of claim 10 wherein said programmable amplifier is operable to change the amplification factor in response to range control signals over a range of one hundred to one in two steps of ten to one, and wherein said amplifier gain range control means comprises a part of a general purpose computer which is programmed to accomplish the amplifier gain range control function.

12. The system of claim 1 comprising means for receiving and correcting the number from said register comprising means for exact measurement of the duration of each conversion interval and means for multiplying the number stored in said register by a function which is a reciprocal of the exact duration measurement from said exact measurement means to thereby correct the number for variations in the conversion interval.

13. The system of claim 12 wherein said timer circuit means comprises a clock means connected to said synchronous converter for controlling the operation of said synchronous converter, said timer circuit means being operable to determine the end of a prior conversion interval and the beginning of a new conversion interval in synchronism with said clock means at clock synchronized times after said predetermined phase of the ac power line voltage.

14. The system of claim 13 wherein said clock means provides clock pulse signals to said synchronous converter at a frequency of F/4 so that the maximum frequency output of said synchronous converter is F/8 and the intervening interval between the end of the prior interval and the beginning of a new conversion interval is synchronized to a multiple frequency of said clock means such that the output pulses from said converter means are generated outside said intervening interval.

15. The system of claim 13 wherein said timer circuit means comprises a single-pulse line synchronization circuit operable to receive clock pulse signals from said clock means at a frequency which is a multiple of the maximum output frequency of said synchronous voltage-to-frequency converter and operable to receive an ac line synchronization signal, said single-pulse line synchronization circuit being operable upon the receipt of the first clock pulse signal after the presence of an ac line synchronization signal to provide a first single pulse output, a shift register delay circuit connected to receive said first single-pulse output and operable in response thereto to emit at least a second pulse output, said single-pulse line synchronization circuit being connected to provide said first single pulse to said register to cause said register to read the count in said counter and said shift register delay circuit being connected to provide said second pulse output to said counter to reset said counter to begin a new conversion interval.

16. The system of claim 15 wherein said clock means generates clock pulse signals in multiples of a predetermined frequency F and said second pulse output being delayed from said first pulse output by ½ of the interval of the frequency F.

17. The system of claim 15 wherein said clock means generates clock pulse signals in multiples of a predetermined frequency F, said clock means providing clock pulse signals to said synchronous converter at a frequency F/4 such that the maximum output frequency of said synchronous converter is F/8, and said clock pulse signals received by said single-pulse line synchronization circuit from said clock means being at a frequency of F/2.

18. The system of claim 17 which comprises quadrature logic circuit means interconnecting said clock means and said single-pulse line synchronization circuit means for providing clock pulse signals to said synchronization circuit means at a frequency F/2 and delayed by ½ of the interval of the frequency F, said second pulse output being delayed from said first pulse output by ½ of the interval of the frequency F.

19. The system of claim 13 wherein a programmable gain amplifier is connected to receive and amplify the analog input signal prior to delivery of said analog input signal to said synchronous voltage-to-frequency converter, an amplifier gain range control means connected and operable to receive the successive numbers stored in said register and connected to control said programmable amplifier, said amplifier gain range control means being operable in response to the detection of a number from said register indicating that said synchronous voltage-to-frequency converter is running at maximum frequency to reduce the amplification factor of said programmable amplifier, said amplifier gain range control means being operable upon the detection of a number below a predetermined minimum value to increase the amplification factor of said programmable amplifier, and said amplifier gain range control means including means operable to divide the output from said register by said amplification factor to provide an accurately scaled digital output signal.

20. The system of claim 10 wherein said programmable amplifier is operable to change the amplification factor in response to range control signals over a range of one hundred to one in two steps of ten to one, and wherein said amplifier gain range control means comprises a part of a general purpose computer which is programmed to accomplish the amplifier gain range control function.

21. In a spectrophotometer system having a spectrophotometer providing an analog sample signal, amplifier means for amplifying the analog signal and analog-to-digital conversion means for converting the analog sample signal to an output digital signal comprising a synchronous voltage-to-frequency converter connected to receive the analog input signal voltage and to generate a train of output pulses, a counter connected to receive and count the output pulses from said synchronous voltage-to-frequency converter, a digital register connected to said counter for periodically receiving and storing the count in said counter, a conversion interval timer circuit means connected to control the operation of said counter and said register to determine a conversion interval during which the output pulses from said synchronous voltage-to-frequency converter are accumulated in said counter and then stored in said register, said conversion interval timer circuit means being connected and arranged to receive ac power line voltage and being operable to determine the end of a prior conversion interval and the beginning of a new conversion interval in response to a predetermined phase of a predetermined cycle of the ac power line voltage to exactly synchronize the conversion interval to the ac power line frequency, and said conversion interval timer circuit means being configured and connected to said synchronous voltage-to-frequency converter so as to control the generation of output pulses so that output pulses are generated only during a conversion interval.

* * * * *